US007337266B2

United States Patent
Shen

(10) Patent No.: US 7,337,266 B2
(45) Date of Patent: Feb. 26, 2008

(54) DATA STRUCTURE DESIGN SYSTEM AND METHOD FOR PROLONGING THE LIFE OF AN FRAM

(75) Inventor: Cheng Yin Shen, Tu-chen (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 338 days.

(21) Appl. No.: 11/061,963

(22) Filed: Feb. 17, 2005

(65) Prior Publication Data

US 2005/0180190 A1    Aug. 18, 2005

(30) Foreign Application Priority Data

Feb. 17, 2004    (TW) .............................. 93103695 A

(51) Int. Cl.
*G11C 11/22* (2006.01)

(52) U.S. Cl. .................... 711/103; 711/5; 711/104; 365/145

(58) Field of Classification Search .............. 711/103, 711/5, 104; 365/145
See application file for complete search history.

(56) References Cited

U.S. PATENT DOCUMENTS

| | | | | |
|---|---|---|---|---|
| 6,026,027 A | * | 2/2000 | Terrell et al. .......... | 365/185.33 |
| 6,272,587 B1 | * | 8/2001 | Irons ..................... | 711/103 |
| 6,385,078 B2 | | 5/2002 | Jeon | |
| 6,510,495 B1 | * | 1/2003 | Nobukiyo ............... | 711/143 |
| 6,560,143 B2 | * | 5/2003 | Conley et al. ......... | 365/185.04 |
| 6,571,312 B1 | * | 5/2003 | Sugai et al. ............ | 711/103 |
| 7,173,863 B2 | * | 2/2007 | Conley et al. ......... | 365/189.05 |
| 2001/0052060 A1 | * | 12/2001 | Bao ....................... | 711/167 |
| 2002/0034092 A1 | | 3/2002 | Choi et al. | |
| 2002/0073276 A1 | * | 6/2002 | Howard et al. ......... | 711/113 |
| 2003/0135658 A1 | * | 7/2003 | Haggar et al. .......... | 709/312 |

* cited by examiner

*Primary Examiner*—Hyung Sough
*Assistant Examiner*—Anton Rabovianski
(74) *Attorney, Agent, or Firm*—Wei Te Chung

(57) ABSTRACT

A data structure design system for prolonging the life of an FRAM (Ferroelectric Random Access Memory) includes a CPU (Central Processing Unit) (1), an FRAM (2), an SDRAM (Synchronous Dynamic Random Access Memory) (3), and a clock (4). The FRAM is divided into a plurality of fixed-size blocks, and is for storing data. The SDRAM is for storing data that need to be written to the FRAM, and includes three data structures: queue one, queue two, and hash table. The CPU is for reading data from external storages, storing the data in the SDRAM, reading data from the SDRAM, and writing the data to the FRAM via the three data structures. The clock is for recording a predetermined time used to determine the blocks in the FRAM in which data have not been read up to the predetermined time. A related data structure design method is also provided.

15 Claims, 6 Drawing Sheets

DATA STRUCTURE DESIGN SYSTEM AND METHOD FOR PROLONGING THE LIFE OF AN FRAM

BACKGROUND OF THE INVENTION

1. Field of the Invention

The present invention relates generally to systems and methods for prolonging the life of a memory, and especially to a data structure design system and method for prolonging the life of an FRAM (Ferroelectric Random Access Memory).

2. Description of the Related Art

In recent years, a memory has been a very important part of a data storage apparatus, especially an electric memory. Typical electric memories include RAMs (Random Access Memories) and ROMs (Read Only Memories). Although the read/write speed of a RAM is less than 100 nanoseconds, it cannot perpetually store data. A ROM can perpetually store data; however, its read/write speed is more than a microsecond. These electric memories cannot simultaneously have the two described advantages. Then the FRAM was developed. It has a very fast read/write speed, and can retain data in a power-off state.

The art of FRAM storage has been described in publications such as U.S. Pat. No. 6,385,078, entitled "Ferroelectric Random Access Memory (FRAM) Device and Method for Controlling Read/Write Operations Thereof", and issued on Apr. 7, 2002. In the disclosed FRAM device, an address transition detection circuit generates a pulse signal in response to a transition of a row address latched in an address latch circuit; a flat signal generating circuit generates a chip enable flag in response to an external chip enable signal; a delay circuit delays the pulse signal for a predetermined time; and after the external chip enable signal is enabled, a controller controls a row decoder circuit in a disabled state when the external chip enable signal is disabled during a delay time of the delay circuit, and controls the flag signal generating circuit to disable the chip enable flag signal.

Although the device described above can control read/write operations of the FRAM device to prevent false operations caused by noise spikes, and improve the reliability of the FRAM device, it cannot uniformly use the whole FRAM to store data. Instead, the FRAM always stores data in a critical area. Thus when the FRAM has been used repeatedly, it is liable to wear out and become inoperable. Accordingly, what is needed is a data structure design system and method which can overcome the above-described problems and prolong the life of an FRAM.

SUMMARY OF THE INVENTION

A main objective of the present invention is to provide a data structure design system and method which can uniformly store data in an FRAM (Ferroelectric Random Access Memory) and prolong the life of the FRAM.

To achieve the above objective, the present invention provides a data structure design system for prolonging the life of an FRAM. The system comprises a CPU (Central Processing Unit), an FRAM, an SDRAM (Synchronous Dynamic Random Access Memory), and a clock.

The FRAM is logically divided into a plurality of fixed-size blocks, and is provided for storing data. The SDRAM is for storing data that need to be written to the FRAM, is divided into a plurality of fixed-size blocks, and comprises three data structures: queue one, queue two, and hash table. Queue one comprises n blocks which are either void or for storing unused data in the SDRAM. Each block corresponds to one of void blocks or blocks storing unused data in the FRAM. Queue two comprises m blocks. Each block stores data that will not be used any more and has not been deleted from the FRAM, and corresponds to a block storing the identical data in the FRAM. The hash table contains u blocks. Each block stores data that are being used and have been recorded in the FRAM, and corresponds to a block in the FRAM which stores the in-use data.

The CPU logically divides the FRAM into a plurality of fixed-size blocks, and divides the SDRAM into three storage locations. The CPU further divides each storage location into a plurality of fixed-size blocks, and relates each storage location with a corresponding data structure. The CPU reads data from external storages (not shown) through data buses, and stores the data in the SDRAM. The CPU can also read data from the SDRAM, and write the data to the FRAM via the three data structures. The clock is providing for recording a predetermined time used to determine the blocks in the FRAM in which data have not been read up to the predetermined time.

Further, the present invention provides a data structure design method for prolonging the life of an FRAM. The method comprises the steps of: (a) dividing the FRAM into a plurality of blocks; (b) dividing an SDRAM into three storage locations; (c) dividing each storage location into a plurality of blocks; (d) setting three data structures in the SDRAM: queue one, queue two, and hash table; (e) relating each block in the three data structures with a corresponding block in the FRAM; (f) reading data from an external storage; (g) updating the blocks in queue two; (h) writing the data into void blocks of queue one; and (i) writing the data that need to be written to the FRAM in queue one into corresponding blocks in the FRAM.

Other objects, advantages and novel features of the present invention will be drawn from the following detailed description of a preferred embodiment and preferred methods of the present invention with the attached drawings, in which:

DETAILED DESCRIPTION OF THE PREFERRED EMBODIMENT

Figure 1:
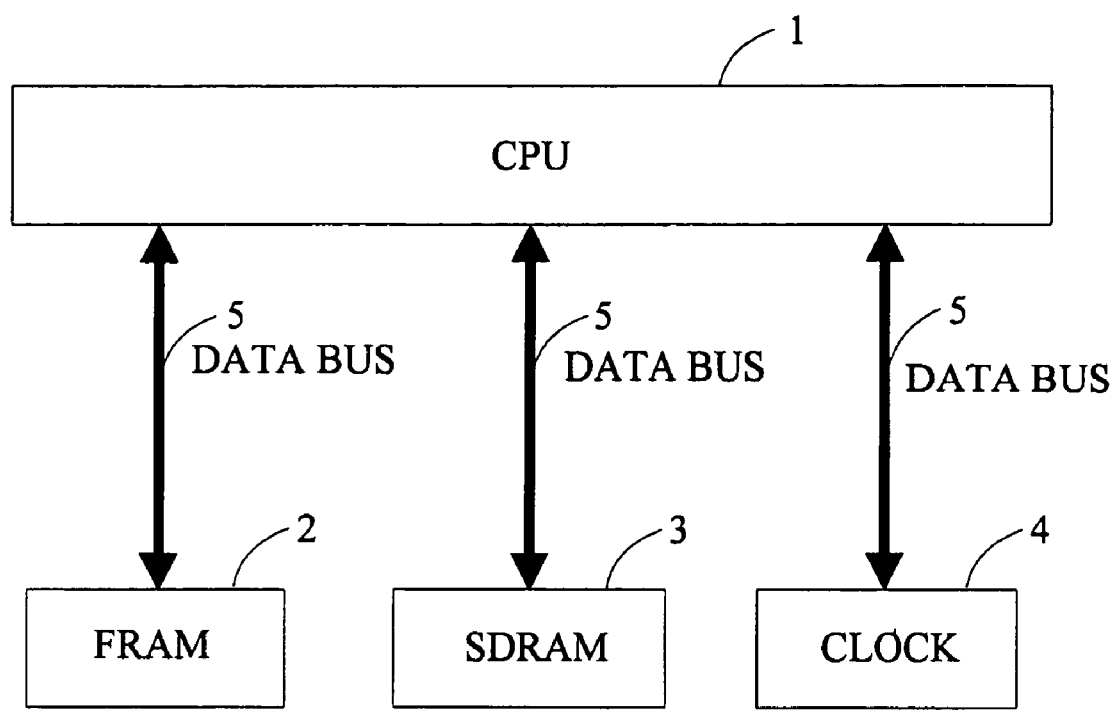
FIG. 1 is a schematic diagram of hardware configuration of a data structure design system for prolonging the life of an FRAM in accordance with a preferred embodiment of the present invention.

FIG. 1 is a schematic diagram of hardware configuration of a data structure design system for prolonging life of an FRAM (hereinafter, "the system") in accordance with the preferred embodiment of the present invention. The system comprises a CPU (Central Processing Unit) 1, an FRAM (Ferroelectric Random Access Memory) 2, an SDRAM (Synchronous Dynamic Random Access Memory) 3, a clock 4, and a plurality of data buses 5. The CPU 1 is connected to the FRAM 2, the SDRAM 3 and the clock 4 through the data buses 5. The FRAM 2 is logically divided into a plurality of fixed-size blocks, and is provided for storing data. The SDRAM 3 stores data that need to be written to the FRAM 2. The CPU 1 divides the FRAM 2 into a plurality of fixed-size blocks, and divides the SDRAM 3 into three storage locations. The CPU 1 further divides each storage location into a plurality of fixed-size blocks, and relates each storage location with a corresponding data structure. The three data structures are named queue one, queue two, and hash table. The CPU 1 reads data from external storages (not shown) through the data buses 5, and stores the read data in the SDRAM 3. The CPU 1 can also read data from the SDRAM 3, and write the data to the FRAM 2 via the three data structures. The clock 4 records a predetermined time used to determine the blocks in the FRAM 2 in which data have not been read up to the predetermined time.

Figure 2:
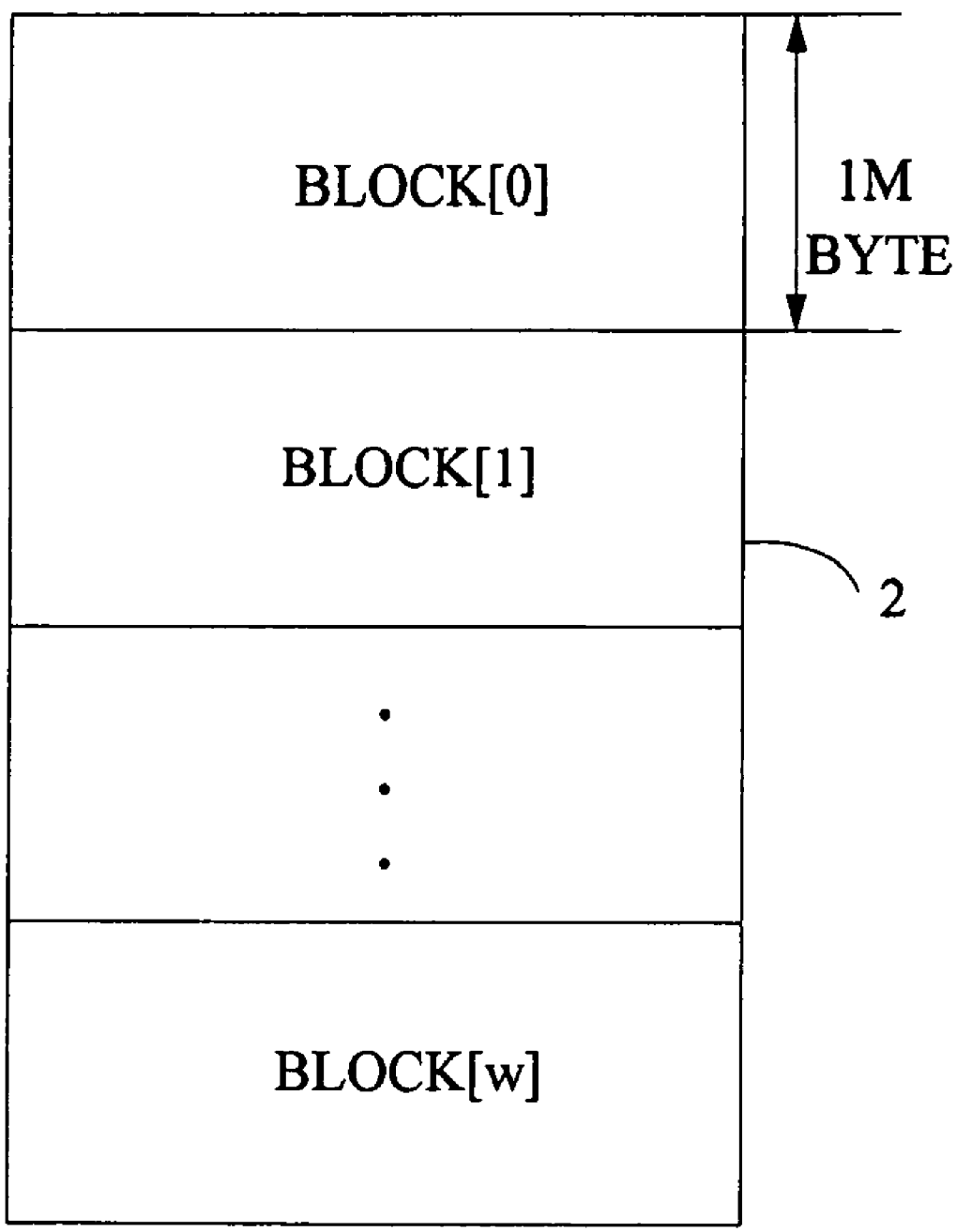
FIG. 2 is a schematic diagram of a storage structure of an FRAM of the system of FIG. 1.

FIG. 2 is a schematic diagram of the storage structure of the FRAM 2. The FRAM 2 is logically divided into a plurality of fixed-size blocks: block[0], block[1], ... block [w]. Preferably, each block is assigned a size of 1 megabyte (MB) for storing data.

Figure 3A:
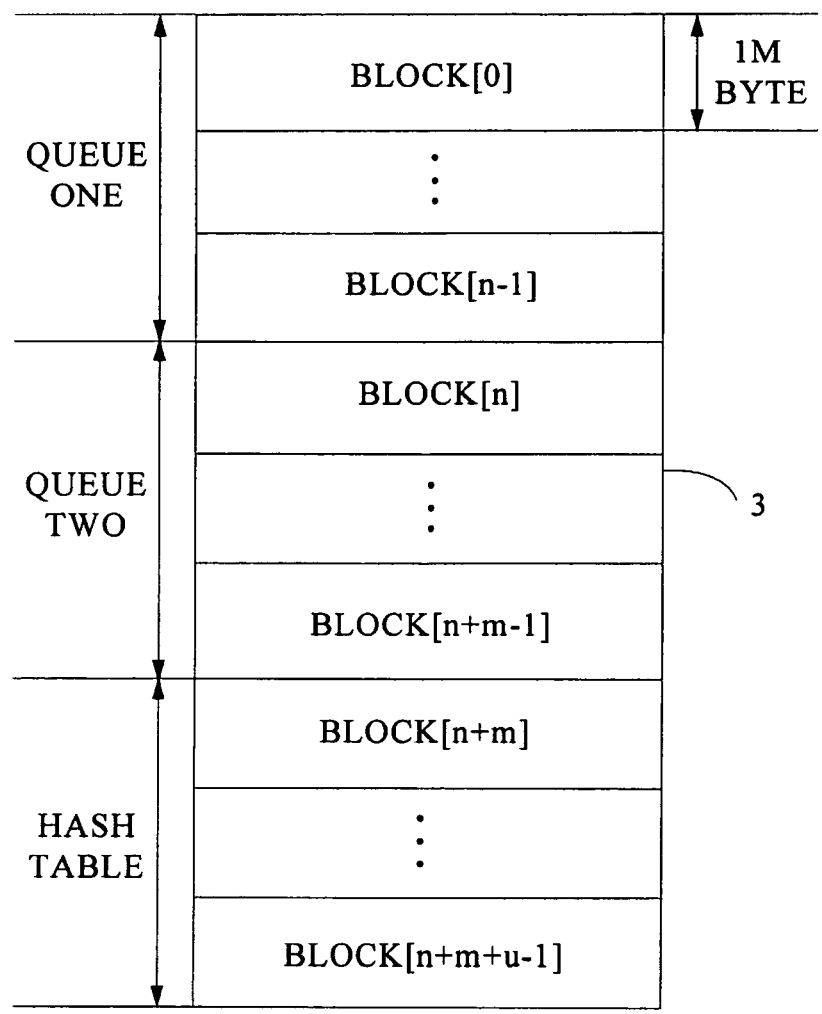
FIG. 3A is a schematic diagram of a storage structure of an SDRAM of the system of FIG. 1.

FIG. 3A is a schematic diagram of the storage structure of the SDRAM 3. The SDRAM 3 is divided into three storage locations. Each storage location is divided into a plurality of blocks. Each block is 1 MB in size. Each storage location corresponds to a data structure. The three data structures are titled: queue one, queue two, and hash table. Queue one comprises n blocks: block[0], block[1], ..., block[n−1]. The blocks are either void or for storing unused data in the SDRAM 3. Each block corresponds to a void block or a block storing unused data in the FRAM 2. Queue two comprises m blocks: block[n], block[n+1], ..., block[n+m−1]. Each block stores data that will not be used any more and has not been deleted from the FRAM 2, and corresponds to a block storing the identical data in the FRAM 2. The hash table contains u blocks: block[n+m], block[n+m+1], ..., block[n+m+u−1]. Each block stores data that are being used and have been recorded in the FRAM 2, and corresponds to a block in the FRAM 2 which stores the in-use data.

Figure 3B:
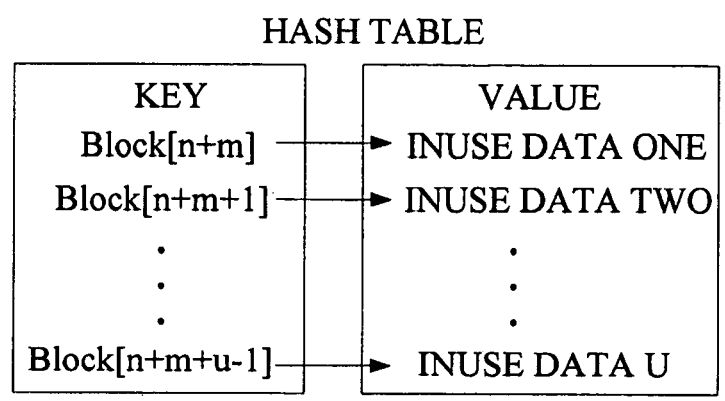
FIG. 3B is a schematic diagram of configuration of a hash table of the SDRAM of FIG. 3A.

FIG. 3B is a schematic diagram of configuration of the hash table. The hash table is a data structure that implements an associative array, and contains two arrays. One array is for keys, and the other array is for values. Each key is associated with one value. The keys are block[n+m], block[n+m+1], ..., block[n+m+u−1], and the associated values are data respectively identified as inuse data one, inuse data two, ..., inuse data U.

Figure 4:
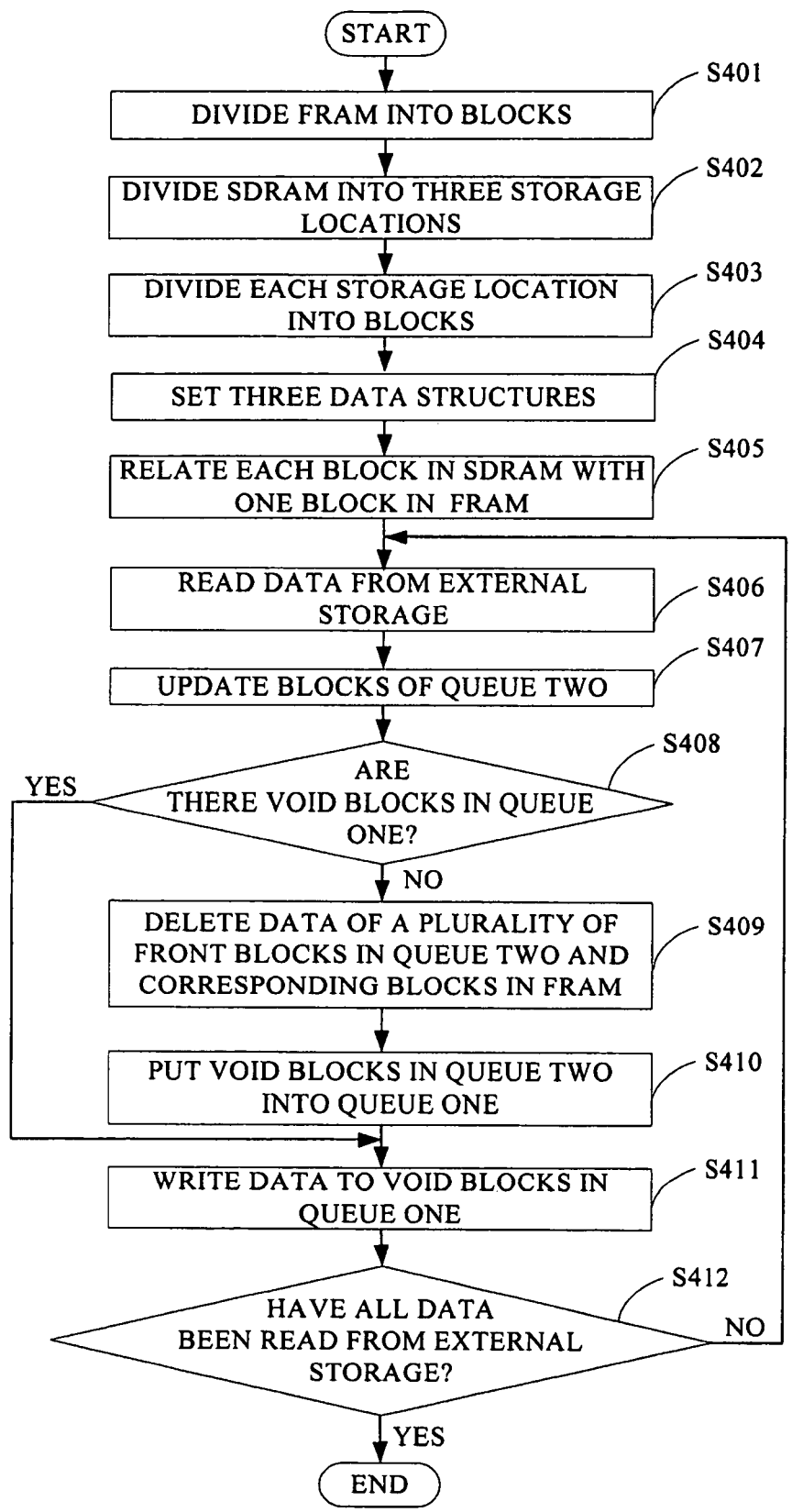
FIG. 4 is a flowchart of a preferred method for writing data from an external storage to the SDRAM of the system of FIG. 1.

FIG. 4 is a flowchart of the preferred method for writing data from an external storage to the SDRAM 3 by implementing the above-described system. In step S401, the CPU 1 divides the FRAM 2 into a plurality of blocks. In step S402, the CPU 1 divides the SDRAM 3 into three storage locations. In step S403, the CPU 1 divides each storage location into a plurality of blocks. In step S404, the CPU 1 sets three data structures in the SDRAM 3: queue one, queue two, and hash table. In step S405, the CPU 1 relates each block in the three data structures with a corresponding block in the FRAM 2. In step S406, the CPU 1 reads data from the external storage through the data buses 5. In step S407, the CPU 1 updates blocks in queue two. In step S408, the CPU 1 determines whether there are void blocks in queue one of the SDRAM 3. If there are void blocks in queue one, the procedure goes directly to step S411 described below. If there are no void blocks in queue one, in step S409, the CPU 1 deletes data in a plurality of front blocks of queue two, and deletes data in corresponding blocks of the FRAM 2. In step S410, the CPU 1 puts the void blocks which previously stored deleted data in queue two into queue one, whereupon the procedure goes to step S411. In step S411, the CPU 1 writes the data from the external storage to the void blocks of queue one. In step S412, the CPU 1 determines whether all data from the external storage have been read. If there are data that have not been read from the external storage, the procedure returns to step S406 described above. If all data have been read from the external storage, the procedure is ended.

Figure 5:
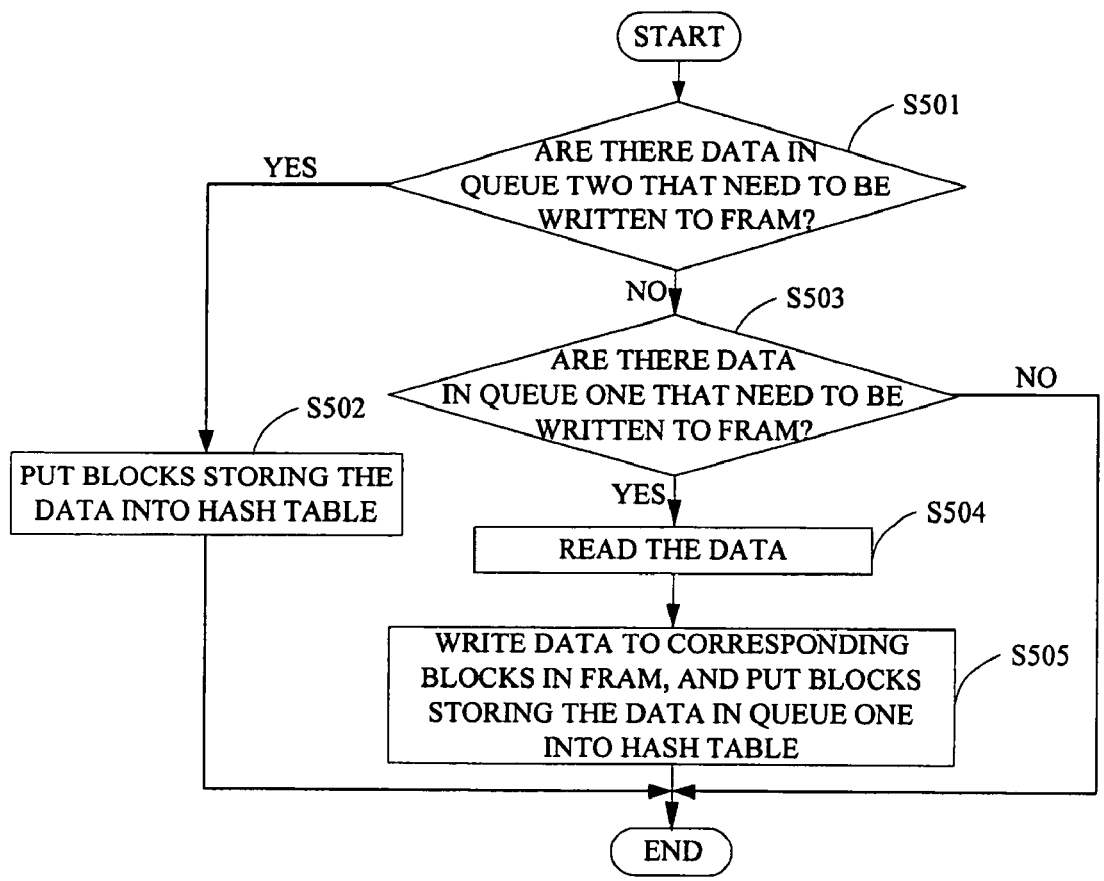
FIG. 5 is a flowchart of a preferred method for writing data from the SDRAM to the FRAM of the system of FIG. 1.

FIG. 5 is a flowchart of the preferred method for writing data from the SDRAM 3 to the FRAM 2 by implementing the above-described system. In step S501, the CPU 1 determines whether there are data in queue two that need to be written to the FRAM 2. If there are data in queue two that need to be written to the FRAM 2, in step S502, the CPU 1 writes the data to the FRAM 2, and puts the blocks storing the data into the hash table, whereupon the procedure is ended. If there are no data in the queue two that need to be written to the FRAM 2, in step S503, the CPU 1 determines whether there are data in queue one that need to be written to the FRAM 2. If there are no data in queue one that need to be written to the FRAM 2, the procedure is ended. If there are data in queue one that need to be written to the FRAM 2, in step S504, the CPU 1 reads the data. Then in step S505, the CPU 1 writes the data to corresponding blocks of the FRAM 2, and puts the blocks storing the data in queue one into the hash table, whereupon the procedure is ended.

Figure 6:
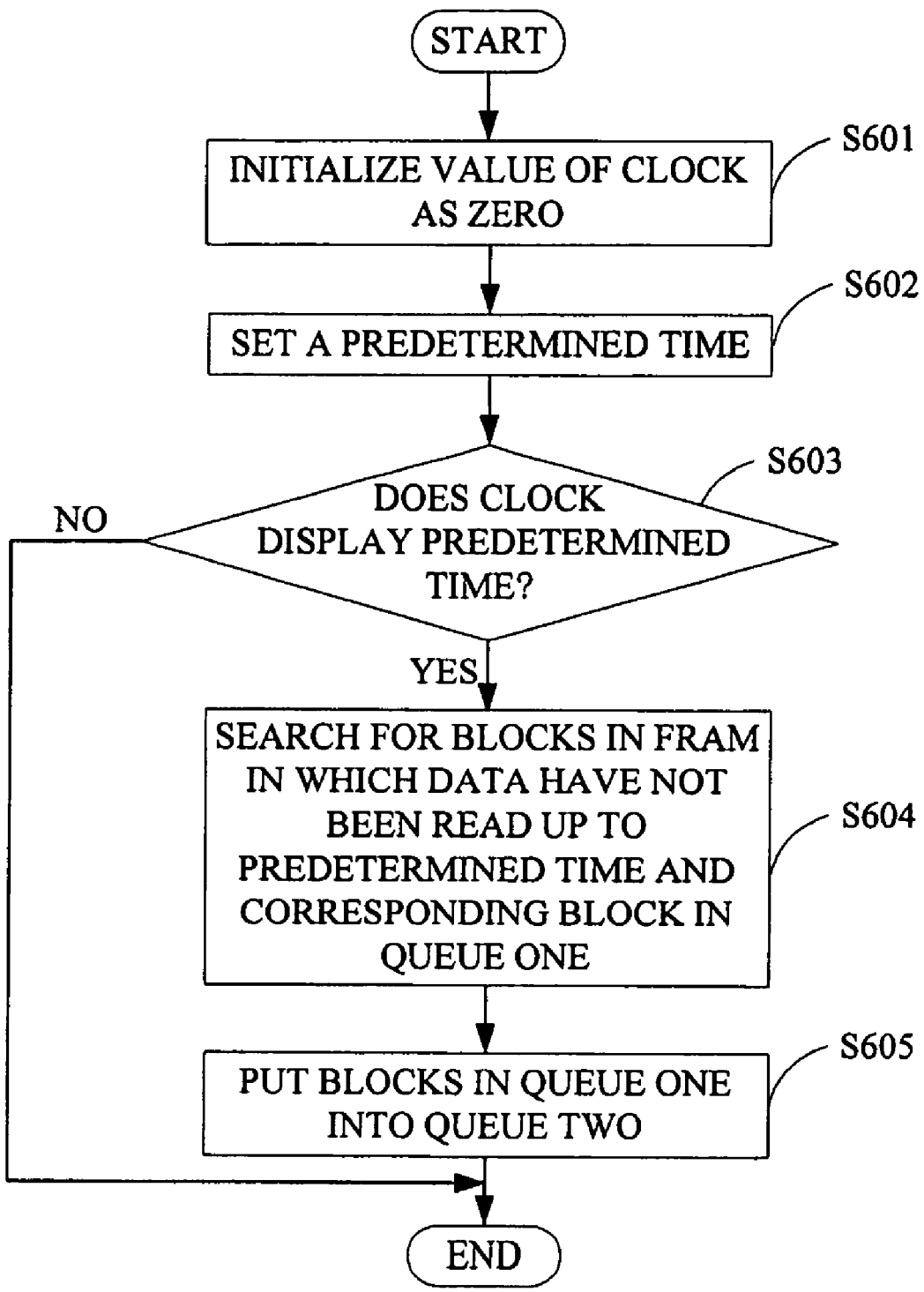
FIG. 6 is a flowchart of a preferred method for updating blocks in a so-called queue two data structure of the SDRAM of the system of FIG. 1.

FIG. 6 is a flowchart of the preferred method for updating blocks_in queue two by implementing the above-described system. In step S601, the CPU 1 initializes a value of the clock 4 as zero. In step S602, the CUP 1 sets a predetermined time in the clock 4. In step S603, the CPU 1 determines whether the clock 4 displays the predetermined time. If the CPU 1 does not display the predetermined time, the procedure is ended. If the clock 4 displays the predetermined time, in step S604, the CPU 1 searches for blocks in the FRAM 2 in which data have not been read up to the predetermined time and corresponding blocks in queue one. Then in step S605, the CPU 1 puts the blocks in queue one into queue two, whereupon the procedure is ended.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A data structure design system for prolonging the life of an FRAM (Ferroelectric Random Access Memory), the system comprising:
    an FRAM divided into a plurality of fixed-size blocks for storing data;
    an SDRAM (Synchronous Dynamic Random Access Memory) for storing data that need to be written to the FRAM, the SDRAM being divided into a plurality of fixed-size blocks, and comprising three data structures: queue one comprising blocks that are either void or for storing unused data, queue two comprising blocks that will not be used any more and have not been deleted from the FRAM, and a hash table containing blocks storing data that are being used and have been recorded in the FRAM;

a CPU (Central Processing Unit) for reading data from external storages, for storing the data in the SDRAM, for reading the data from the SDRAM, for writing the data to the FRAM via the three data structures, and for putting the blocks storing the data into the hash table; and a clock for recording a predetermined time used to determine the blocks in the FRAM in which data have not been read up to the predetermined time.

2. The system as claimed in claim 1, wherein the CPU is connected with the FRAM, the SDRAM and the clock through data buses.

3. The system as claimed in claim 1, wherein each block in queue one corresponds to one of void blocks and blocks storing unused data in the FRAM.

4. The system as claimed in claim 1, wherein each block in queue two corresponds to a block storing the identical data in the FRAM.

5. The system as claimed in claim 1, wherein each block in the hash table corresponds to a block in the FRAM which stores the same data.

6. A data structure design method for prolonging the life of an FRAM (Ferroelectric Random Access Memory), comprising the steps of:
dividing the FRAM into a plurality of blocks;
dividing an SDRAM (Synchronous Dynamic Random Access Memory) into three storage locations;
dividing each storage location into a plurality of blocks;
setting three data structures in the SDRAM: queue one, queue two, and hash table;
relating each block in the three data structures with a corresponding block in the FRAM;
reading data from an external storage;
updating the blocks in queue two;
writing the data into void blocks of queue one;
writing the data that need to be written to the FRAM in queue one into corresponding blocks in the FRAM; and
putting the blocks storm the data into the hash table.

7. The method as claimed in claim 6, further comprising the step of determining whether there are void blocks in queue one of the SDRAM.

8. The method as claimed in claim 7, wherein the step of determining whether there are void blocks in queue one of the SDRAM comprises the steps of:
writing the data to the void blocks if there are void blocks in queue one;
deleting data in a plurality of blocks of queue two and in corresponding blocks of the FRAM if there are no void blocks in queue one; and
putting the void blocks in queue two which previously stored deleted data into queue one.

9. The method as claimed in claim 6, further comprising the step of determining whether all data have been read from the external storage.

10. The method as claimed in claim 9, wherein the step of determining whether all data have been read from the external storage comprises the steps of:
reading data from the external storage if there are data that have not been read from the external storage; and
determining whether there are data in queue two that need to be written to the FRAM if data have been read from the external storage.

11. The method as claimed in claim 10, wherein the step of determining whether there are data in queue two that need to be written to the FRAM comprises the steps of:
putting the blocks storing the data into the hash table if there are data in queue two that need to be written to the FRAM; and
determining whether there are data in queue one if there are no data in queue two that need to be written to the FRAM.

12. The method as claimed in claim 11, wherein the step of determining whether there are data in queue one that need to be written to the FRAM further comprises the step of:
reading the data if there are data in queue one.

13. The method as claimed in claim 6, wherein the step of updating the blocks in queue two comprises the steps of:
initializing a value of the clock as zero;
setting a predetermined time in the clock;
determining whether the clock displays the predetermined time according to the value of the clock, and searching for blocks in the FRAM in which data have not been read up to the predetermined time and corresponding blocks in queue one if the clock displays the predetermined time; and
putting the blocks in queue one into queue two.

14. A computer-enabled data structure design method for prolonging the life of an FRAM (Ferroelectric Random Access Memory), comprising the steps of:
dividing the FRAM into a plurality of blocks;
dividing an SDRAM (Synchronous Dynamic Random Access Memory) into at least three storage locations;
dividing each storage location into a plurality of blocks;
setting three data structures in the SDRAM; queue one, queue two, and hash table;
relating each block in the three data structures with a corresponding block in the FRAM;
putting the blocks storing data in queue two into the hash table, if there are data in queue two that need to be written to the FRAM;
determining whether there are other data in queue one if there are no data in queue two that need to be written to the FRAM; and
putting the blocks storing said other data into the hash table if there are other data in queue one.

15. The method of claim 14, further comprising the step of;
writing said other data to corresponding blocks in the FRAM.

* * * * *